United States Patent
Moritoki

(10) Patent No.: US 8,143,152 B2
(45) Date of Patent: Mar. 27, 2012

(54) MANUFACTURING METHOD OF SEMICONDUCTOR DEVICE HAVING SELF-ALIGNED CONTACT CONNECTED TO SILICIDE LAYER ON SUBSTRATE SURFACE

(75) Inventor: Masashige Moritoki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/503,464

(22) Filed: Jul. 15, 2009

(65) Prior Publication Data

US 2010/0015789 A1    Jan. 21, 2010

(30) Foreign Application Priority Data

Jul. 18, 2008 (JP) .................................. 2008-187325

(51) Int. Cl.
*H01L 21/28* (2006.01)
(52) U.S. Cl. ........ 438/586; 438/694; 438/129; 438/253; 438/581; 438/755; 257/208; 257/330; 257/382; 257/E21.158; 257/E21.249
(58) Field of Classification Search ............... 438/586, 438/128, 129, 216, 253, 581, 583, 629, 630, 438/649, 651, 655, 664, 682, 694, 721, 755; 257/E21.158, 208, 211, 324, 330, 336, 344, 257/382–385, 390, 408, 640, E21.249
See application file for complete search history.

(56) References Cited

U.S. PATENT DOCUMENTS

| | | | | |
|---|---|---|---|---|
| 6,133,096 A * | 10/2000 | Su et al. | ......................... | 438/264 |
| 6,613,684 B2 | 9/2003 | Fujimoto | | |
| 6,815,281 B1 | 11/2004 | Inoue et al. | | |
| 6,815,768 B1 | 11/2004 | Aochi | | |
| 7,419,898 B2 * | 9/2008 | Liaw | ............................. | 438/618 |
| 2002/0042202 A1 | 4/2002 | Fujimoto | | |
| 2004/0212010 A1 | 10/2004 | Aochi | | |
| 2009/0280633 A1 * | 11/2009 | Wei | ............................... | 438/597 |

FOREIGN PATENT DOCUMENTS

| | | |
|---|---|---|
| JP | 2001-127270 | 5/2001 |
| JP | 2002-184860 | 6/2002 |
| JP | 2004-327702 | 11/2004 |
| JP | 2008159809 | * 7/2008 |
| KR | 1020040081845 | * 9/2004 |

* cited by examiner

*Primary Examiner* — Hsien Ming Lee
*Assistant Examiner* — Walter H Swanson
(74) *Attorney, Agent, or Firm* — Young & Thompson

(57) ABSTRACT

A semiconductor device 100 includes: a silicon substrate 102; a first gate 114*a* including a gate electrode 108 formed on the silicon substrate 102 and sidewalls 112 formed on the sidewalls of the gate electrode 108; a silicide layer 132 formed lateral to the sidewalls 112 of the first gate 114*a* on a surface of the silicon substrate 102; and a contact 164 which overlaps at least partially in plan view with the first gate 114*a* and reaches to the silicide layer 132 of the surface of the silicon substrate 102; wherein an insulator film is located between the contact 164 and the gate electrode 108 of the first gate 114*a*.

7 Claims, 17 Drawing Sheets

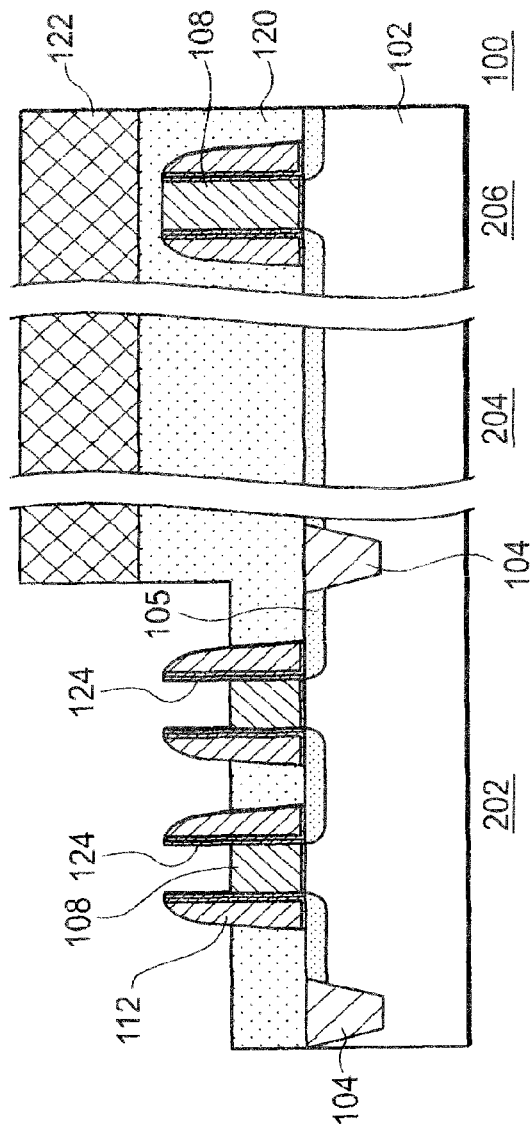
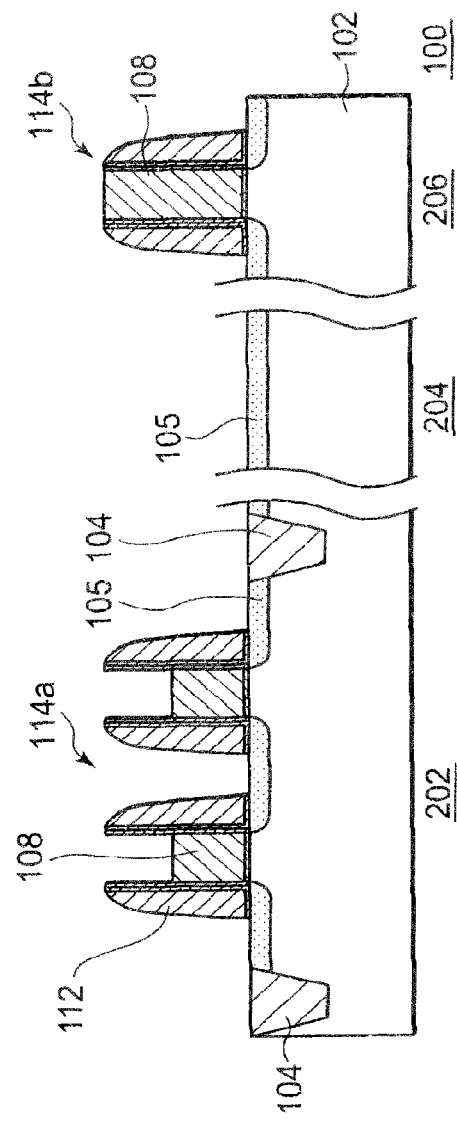
FIG. 3A
FIG. 3B

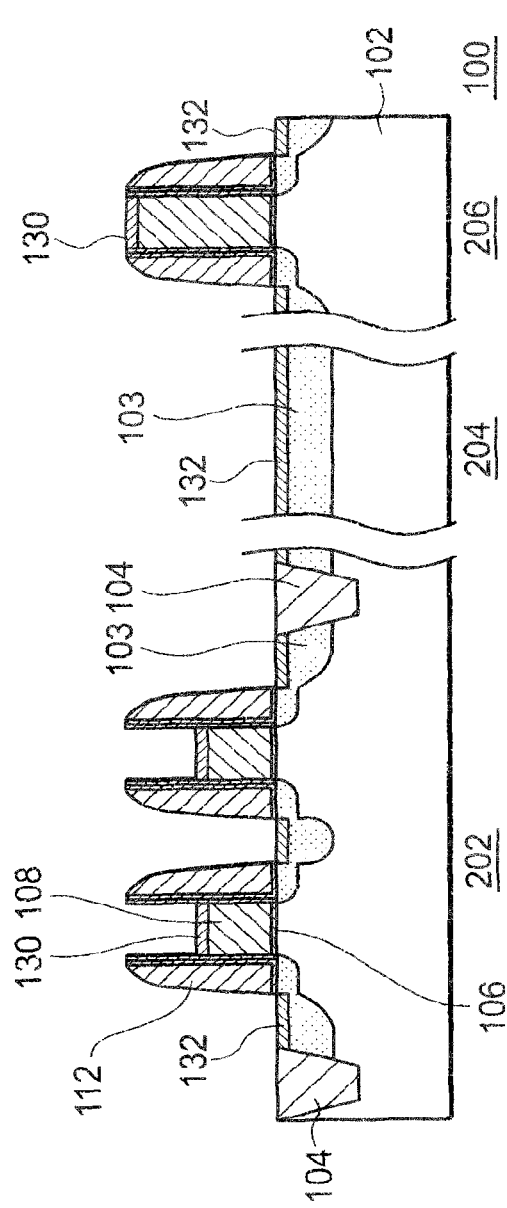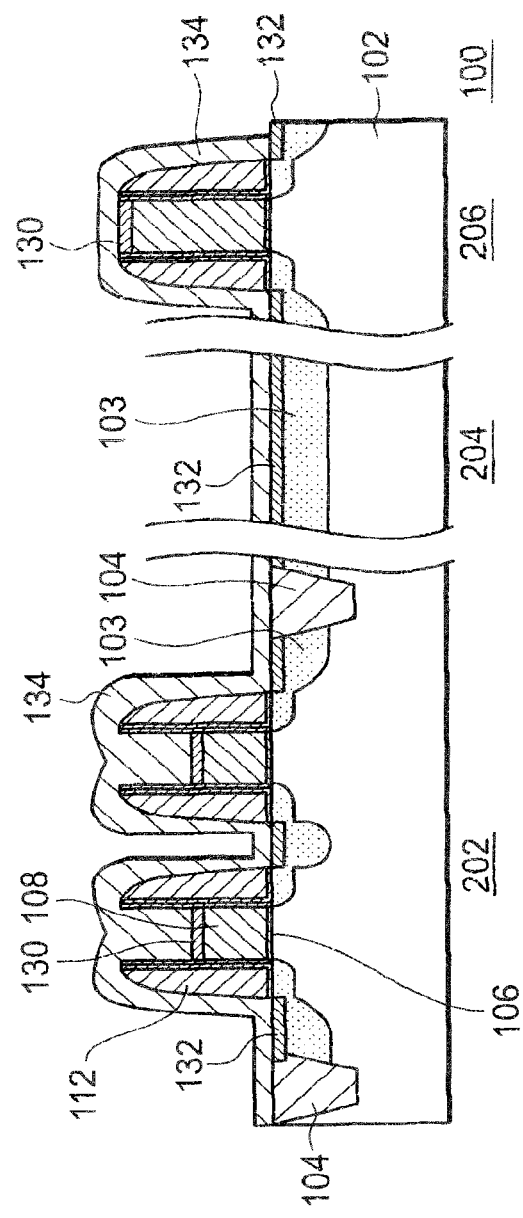
FIG. 4A
FIG. 4B

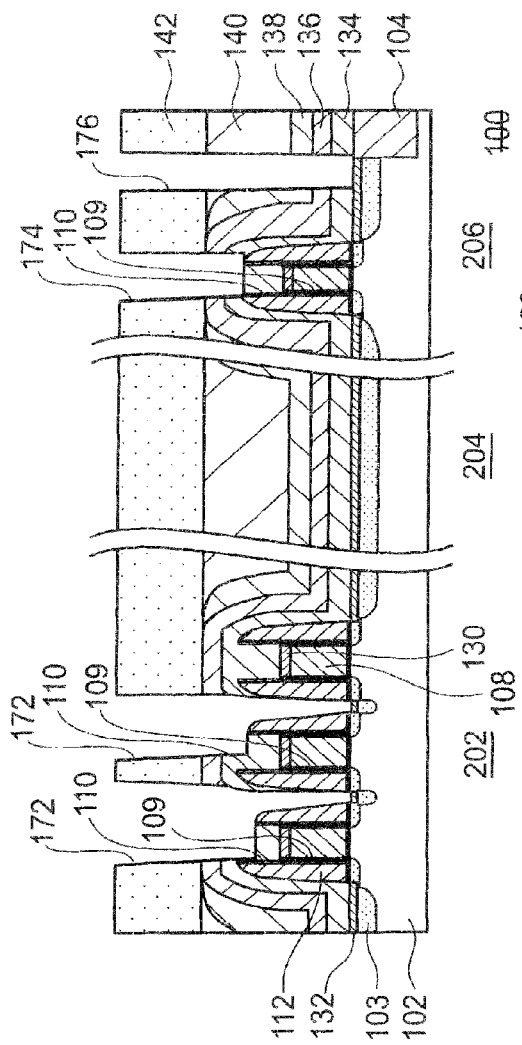
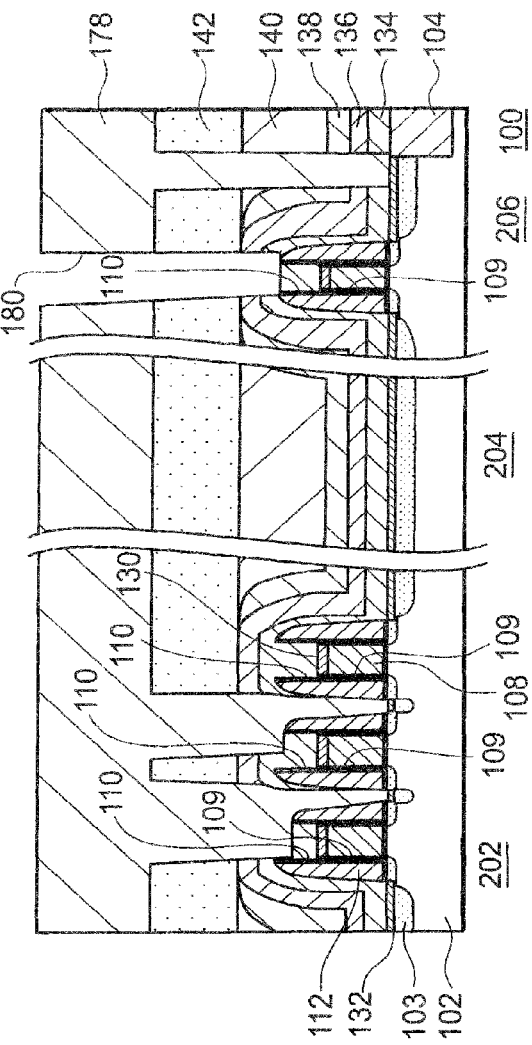
FIG. 13A
FIG. 13B

MANUFACTURING METHOD OF SEMICONDUCTOR DEVICE HAVING SELF-ALIGNED CONTACT CONNECTED TO SILICIDE LAYER ON SUBSTRATE SURFACE

This application is based on Japanese Patent Application No. 2008-187325.

BACKGROUND OF THE INVENTION

The present invention relates to a manufacturing method of a semiconductor device and to the semiconductor device.

In recent years, a gate-to-gate pitch has become increasingly narrower due to the miniaturization of LSI (Large Scale Integration) devices. Consequently, it is extremely difficult to create a contact hole in a region between gates. As a technique to solve such a problem, there is known a self-aligned contact (SAC) structure. There is also known a technique to silicide a surface of a gate electrode made of polysilicon or surfaces of source/drain regions on a surface of a silicon substrate, in order to achieve low resistance and thereby attain high speeds.

Japanese Patent Application Laid-Open No. 2002-184860 describes a technique in which a protective film formed on a conductive portion is previously etched away, the conductive portion is back-filled with an insulator film, and a contact hole open on a semiconductor substrate and a contact hole open on the conductive portion are simultaneously formed by an etching treatment under the same conditions.

Japanese Patent Application Laid-Open No. 2004-327702 describes a configuration in which metal silicides are formed on a source, a drain and a gate electrode of a logic transistor and on a gate electrode of a memory cell transistor, respectively. The patent document states that consequently, it is possible to speed up operation and form a contact for the gate electrode of the memory cell transistor in a self-aligned manner. Thus, it is possible to simultaneously process the gates of the logic transistor and the memory cell transistor.

FIGS. 15 and 16 are cross-sectional views illustrating part of the structure of the memory region of the semiconductor device described in Japanese Patent Application Laid-Open No. 2004-327702, corresponding to U.S. Pat. No. 6,815,768.

Here, an N-type diffusion region 29 is formed on a surface of a P-type well region 11. In addition, a gate oxide film 24, a gate electrode 25, a silicon dioxide film 26, a cap insulator film 27, a silicon nitride film 28, a silicon nitride film 33, and a silicon dioxide film 34 are formed on and above the P-type well region 11 (FIG. 15A). As the cap insulator film 27, a silicon dioxide film is shown by way of example. In addition, the gate electrode 25 is composed of a polysilicon film.

Also shown in FIG. 15A are a pair of trench capacitors 14, isolation regions 15, trenches 16, embedded plate electrodes 17, dielectric film 18, polycrystalline silicon film 19, silicon oxide film 20, polycrystalline silicon film 21 and diffusion regions 32.

After this, the silicon nitride film 33 exposed on the surface of the P-type well region 11 is removed to expose the cap insulator film 27. The cap insulator film 27 and the silicon dioxide film 26 are removed by etching to expose a surface of the gate electrode 25. At this time, a concave portion is formed on the gate electrode 25 inside the silicon nitride films 28 serving as sidewalls. Subsequently, the surface of the gate electrode 25 is silicided to form a metal silicide film 36 (FIG. 15B). After that, a silicon nitride film 37 is formed over the entire surface of the P-type well region 11 to fill the concave portion inside the silicon nitride films 28 with the silicon nitride film 37 (FIG. 15C). Then, the surface of the silicon nitride film 37 is planarized to expose the silicon dioxide film 34 (FIG. 16A). After that, a silicon dioxide film 38 is formed on the entire surface of the P-type well region 11 and the silicon dioxide film 38, the silicon dioxide film 34, and the silicon nitride film 33 are removed by etching, thereby forming a contact hole 39. Subsequently, a conductive material is buried in the contact hole 39 to form a contact 40 (FIG. 16B). On the other hand, in a logic region, the silicon dioxide film 34 and the silicon nitride film 33 are previously removed prior to the step of siliciding the surface of the gate electrode 25 illustrated in FIG. 15B, to expose a substrate surface, though this is not illustrated. Then, the substrate surface is also silicided in the step of siliciding the surface of the gate electrode 25 illustrated in FIG. 15B.

Furthermore, Japanese Patent Application Laid-Open No. 2001-127270 describes a DRAM-embedded semiconductor device in which a DRAM section and a logic section are formed on the same substrate and the entire surfaces of the source/drain regions and the gate surfaces of transistors in at least the DRAM section and the logic section are silicided.

However, the inventor of this application has newly discovered that such problems as described below arise if an attempt is made to form a self-aligned contact and silicide a location where the contact connects to a silicon substrate.

These problems will be explained by referring to FIGS. 15 and 16. In order to form silicide on a surface of the silicon substrate, the silicon substrate needs to be exposed prior to silicidation. However, in order to expose the surface of the silicon substrate prior to the step of forming silicide on a surface of the gate electrode 25 illustrated in FIG. 15B, the silicon dioxide film 34 and the silicon nitride film 33 need to be removed by etching. For this reason, there has been the problem that a surface of the P-type well region 11 suffers damage or an element-isolating insulator film (STI: Shallow Trench Isolation) formed on the surface of the P-type well region 11 suffers a film reduction, when the silicon dioxide film 34 and the silicon nitride film 33 are etched.

SUMMARY

According to the present invention, there is provided a method for manufacturing a semiconductor device, including:

forming a first gate including a gate electrode made of polysilicon formed on a silicon substrate and sidewalls formed on the sidewalls of the gate electrode;

forming an organic film over the entire surface of the silicon substrate to bury the first gate;

removing the upper portion of the organic film to expose the upper surface of polysilicon of the gate electrode;

removing the exposed polysilicon of the gate electrode to a predetermined depth with a surface of the silicon substrate protected by the organic film, thereby forming a concave portion in an upper portion inside the sidewalls;

removing the organic film by ashing to expose the surface of the silicon substrate;

forming a silicide layer on the surface of the silicon substrate with the surface of the silicon substrate exposed;

forming insulator films over the entire surface of the silicon substrate to fill the concave portion inside the sidewalls with the insulator films;

forming a mask film having a first opening, which overlaps at least partially in plan view with the first gate and is open in a region on the silicide layer of the surface of the silicon substrate lateral to the gate electrode, over the entire surface of the silicon substrate;

selectively removing the insulator films using the mask film to form a first contact hole reaching to the silicide layer of the surface of the silicon substrate; and burying a conductive material in the contact hole to form a self-aligned contact which connects to the silicide layer of the surface of the silicon substrate and is placed with the insulator film interposed between the self-aligned contact and the gate electrode.

According to the above-described manufacturing method, the surface of the silicon substrate is covered with the organic film when the concave portion is formed in the upper portion inside the sidewalls. Consequently, the surface of the silicon substrate does not suffer damage even if etching or the like is performed in order to form the concave portion. In addition, the organic film can be removed by ashing after the concave portion is formed. Consequently, it is possible to expose the surface of the silicon substrate without causing film reductions in the insulator films composing sidewalls and the like on and above the silicon substrate and in an element-isolating insulator film and the like formed on the surface of the silicon substrate. It is also possible to prevent damage to the surface of the silicon substrate when the organic film is removed. Consequently, it is possible to silicide the surface of the silicon substrate in a simplified manner. In addition, since sidewalls are left without being subjected to a film reduction, it is possible to form a thick insulator film on a gate when an insulator film is formed over the entire surface of the silicon substrate. This enables the contact and the gate electrode to be arranged with the insulator film interposed therebetween. Consequently, it is possible to form a self-aligned contact. Accordingly, it is possible to attain both the self-aligned contact and a silicided structure of the substrate.

According to the present invention, there is provided a semiconductor device including:

a silicon substrate;

a first gate including a gate electrode formed on the silicon substrate and sidewalls formed on the sidewalls of the gate electrode;

a silicide layer formed lateral to the sidewalls of the first gate on a surface of the silicon substrate; and a first contact which overlaps at least partially in plan view with the first gate and reaches to the silicide layer of the surface of the silicon substrate;

wherein an insulator film is located between the first contact and the gate electrode of the first gate.

Self-aligned contacts have also been able to be formed using conventional techniques. On the other hand, it has been difficult in reality to attain both a self-aligned contact and a silicided structure of a substrate since such a problem as described above has been present. However, using the above-described method of the present invention, it is possible to attain both the self-aligned contact and the silicided structure of the substrate, while reducing damage to the substrate surface. By adopting such a structure, it is possible to reduce a gate-to-gate distance and thereby miniaturize a semiconductor device using the self-aligned contact. In addition, by siliciding the substrate, it is possible to speed up transistors. Consequently, it is possible to downsize the peripheral circuit of transistors and further miniaturize the semiconductor device.

It should be noted that any arbitrary combinations of the above-described constituent elements and the expressions according to the present invention changed among a method, an apparatus or the like are also valid as aspects of the present invention.

BRIEF DESCRIPTION OF THE DRAWINGS

The above and other objects, advantages and features of the present invention will be more apparent from the following description taken in conjunction with the accompanying drawings, in which:

FIGS. 3A and 3B are also cross-sectional process drawings illustrating manufacturing steps of a semiconductor device in an embodiment of the present invention;

FIGS. 4A and 4B are also cross-sectional process drawings illustrating manufacturing steps of a semiconductor device in an embodiment of the present invention;

FIGS. 13A and 13B are also cross-sectional process drawings illustrating manufacturing steps of a semiconductor device in an embodiment of the present invention;

DETAILED DESCRIPTION OF PREFERRED EMBODIMENTS

Figure 1A:
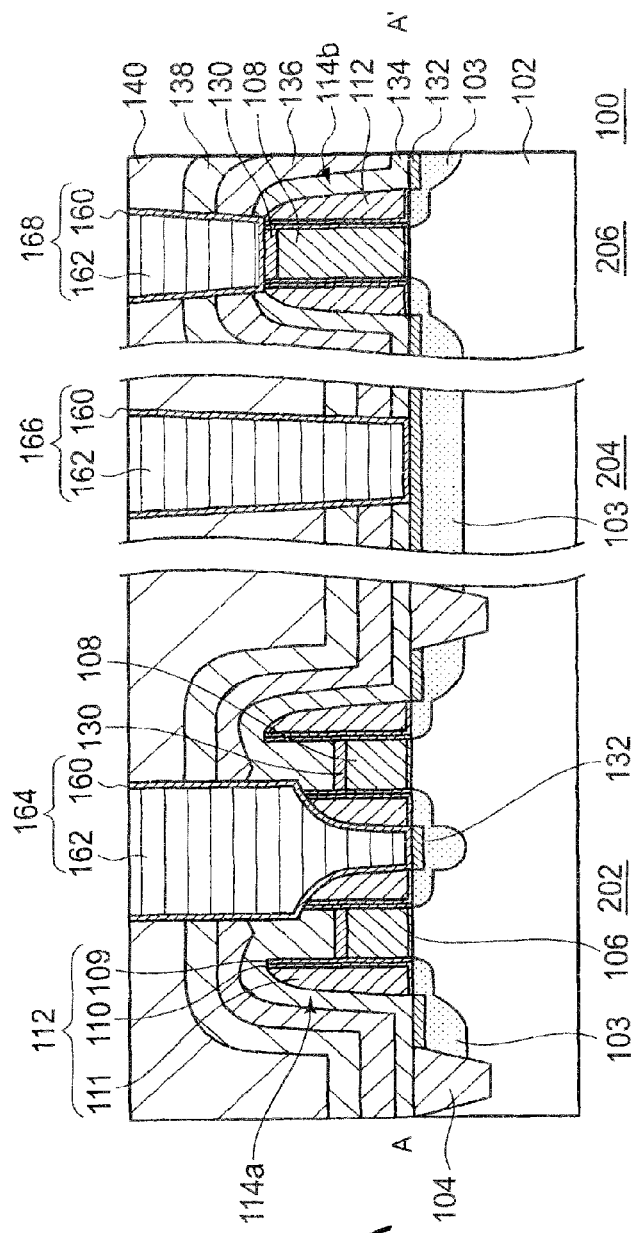
FIGS. 1A and 1B are schematic views illustrating one example of a configuration of a semiconductor device in an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described using the accompanying drawings. Note that like constituent elements are denoted by like reference numerals throughout the drawings and will be excluded from the description as appropriate.

First Embodiment

Figure 1B:
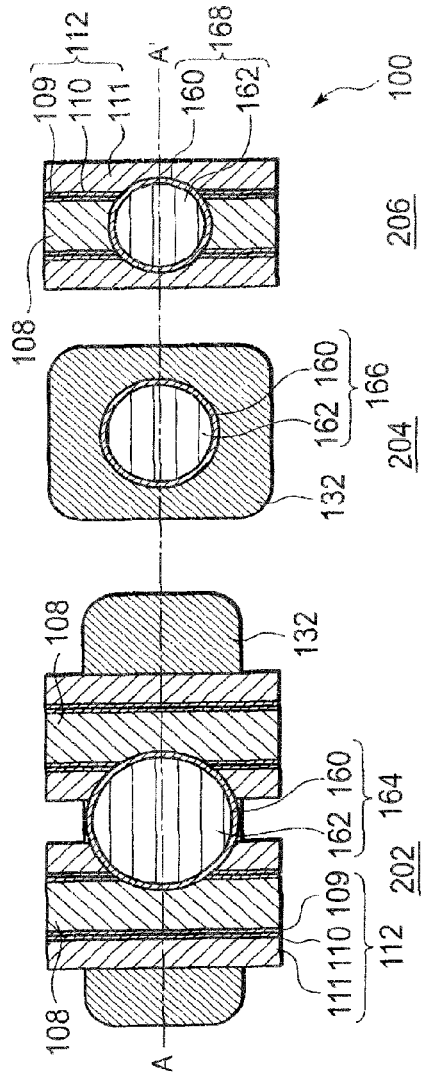

FIG. 1 is a schematic view illustrating one example of a configuration of a semiconductor device in the present embodiment, wherein FIG. 1A is a cross-sectional view illustrating a configuration of a semiconductor device 100 and FIG. 1B is top view illustrating the configuration of the semiconductor device 100. FIG. 1A corresponds to the A-A' cross-sectional view of FIG. 1B.

The semiconductor device 100 has a silicon substrate 102. A memory region 202, a diffusion region 204, and a logic region 206 are provided on the silicon substrate 102. The diffusion region 204 is a region in which transistors are not formed but a wide diffusion layer is formed. The semiconductor device 100 can be configured so that the memory region 202 and the logic region 206 including logics (circuit) are integrated on the same substrate.

The semiconductor device 100 includes source/drain regions 103 and an element-isolating insulator film 104 provided on a surface of the silicon substrate 102, a first gate 114a and a second gate 114b provided on the silicon substrate 102, and an insulator film 134, an etch stopper film 136, an insulator film 138 and an interlayer insulator film 140 formed in this order on and above the silicon substrate 102.

The first gate 114a and the second gate 114b are buried by the insulator film 134, the etch stopper film 136, the insulator film 138 and the interlayer insulator film 140. The first gate 114a and the second gate 114b respectively include a gate electrode 108, a gate insulator film 106 formed between the silicon substrate 102 and the gate electrode 108, and sidewalls 112 provided lateral to the gate electrode 108. In the present embodiment, the sidewalls 112 are composed of an insulator film 109 formed on a side surface of the gate electrode 108, a liner insulator film 110, and a insulator film 111 formed on the liner insulator film 110.

In the present embodiment, a silicide layer 132 is formed in a region lateral to the gate, other than the regions of the surface of the silicon substrate 102 in which the first gate 114a and the second gate 114b are formed. In addition, in the present embodiment, the gate electrode 108 can be made of polysilicon. A silicide layer 130 is likewise formed on a surface of the gate electrode 108.

Furthermore, in the present embodiment, contacts 164, 166 and 168 are formed in the memory region 202, the diffusion region 204, and the logic region 206, respectively. Each contact is composed of a barrier metal film 160 and a metal film 162.

The contact 164 provided in the memory region 202 is formed so as to overlap, at least partially in plan view, with the first gate 114a. That is, in the present embodiment, the contact 164 can be formed so as to overlap, at least partially in plan view, with the gate electrode 108 of the first gate 114a. In addition, the contact 164 reaches to the silicide layer 132 of the surface of the silicon substrate 102 and is electrically connected to the silicide layer 132. In the present embodiment, insulator films, such as the insulator film 134, exist between the contact 164 of the memory region 202 and the silicide layer 130 of the first gate 114a, so that the contact 164 and the gate electrode 108 of the first gate 114a are not electrically connected to each other.

In the present embodiment, the contact 164 is a self-aligned contact which is formed in a self-aligned manner. That is, a contact hole used to form the contact 164 is formed as the result that the sidewalls 112 of the first gate 114a, the insulator film 134 formed thereon, and the etch stopper film 136 are etched in a self-aligned manner.

In the present embodiment, a concave portion having a predetermined depth is formed in the upper portion of the sidewalls 112 of the first gate 114a in a region in which such a self-aligned contact is formed. In addition, the insulator film 134 is filled in the concave portion. By controlling the depth of this concave portion and the thickness of the insulator film 134 for filling the concave portion, it is possible to leave the insulator film 134 on the silicide layer 130 when forming the contact hole used to form the contact 164. Consequently, it is possible to prevent the contact 164 from being electrically connected to the gate electrode 108.

The contact 166 provided in the diffusion region 204 reaches to the silicide layer 132 of the surface of the silicon substrate 102 and is electrically connected to the silicide layer 132. The contact 168 provided in the logic region 206 is formed so as to overlap in plan view with the gate electrode 108 of the second gate 114b. The contact 168 is electrically connected to the gate electrode 108 through the silicide layer 130 on the gate electrode 108 of the second gate 114b.

Note here that for easier understanding of layouts, FIG. 1B only shows the silicide layer 132, the respective gate electrodes 108 and the sidewalls 112 of the first gate 114a and the second gate 114b, and the contacts 164, 166 and 168.

Next, an explanation will be made of manufacturing steps of the semiconductor device 100 in the present embodiment.

FIGS. 2 to 5 are cross-sectional process drawings illustrating manufacturing steps of the semiconductor device 100 in the present embodiment.

In the present embodiment, a method for manufacturing the semiconductor device 100 includes:

forming a first gate 114a including a gate electrode 108 made of polysilicon formed on a silicon substrate 102 and sidewalls 112 formed on the sidewalls of the gate electrode 108;

forming an organic film 120 over the entire surface of the silicon substrate 102 to bury the first gate 114a;

removing the upper portion of the organic film 120 to expose the upper surface of polysilicon of the gate electrode 108;

removing the exposed polysilicon of the gate electrode 108 to a predetermined depth with a surface of the silicon substrate 102 protected by the organic film 120, thereby forming a concave portion 124 in an upper portion inside the sidewalls 112;

removing the organic film 120 by ashing to expose the surface of the silicon substrate 102;

forming a silicide layer 132 on the surface of the silicon substrate 102 with the surface of the silicon substrate 102 exposed;

forming insulator films (the insulator film 134, the etch stopper film 136, the insulator film 138, the interlayer insulator film 140, and the like) over the entire surface of the silicon substrate 102 to fill the concave portion 124 with the insulator films;

forming a mask film having a first opening, which overlaps partially in plan view with the gate electrode 108 of the first gate 114a and is open in a region on the silicide layer 132 of the surface of the silicon substrate 102 lateral to the gate electrode 108, over the entire surface of the silicon substrate 102;

selectively removing the insulator films using the mask film to form a contact hole 150 (first contact hole) reaching to the silicide layer 132 of the surface of the silicon substrate 102; and burying a conductive material (the barrier metal film 160 and the metal film 162) in the contact hole 150 to form a contact 164 (self-aligned contact) which connects to the silicide layer 132 of the surface of the silicon substrate 102 and is placed with an insulator film interposed between the contact 164 and the gate electrode 108.

Figure 2A:
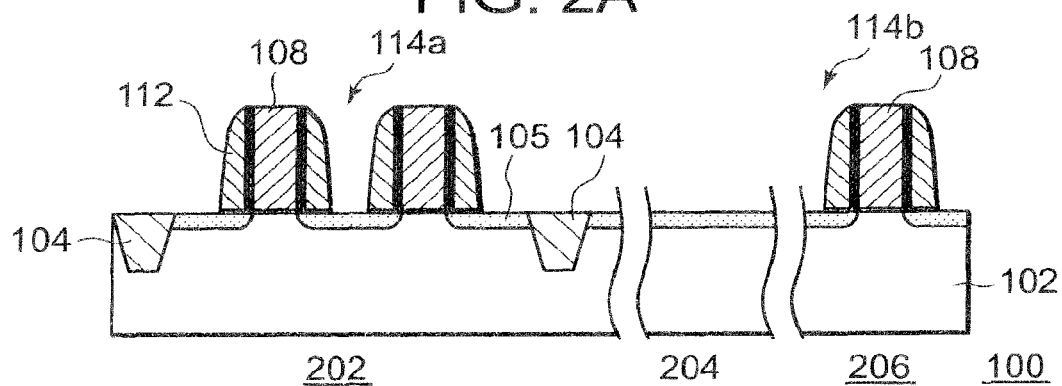
FIGS. 2A, 2B and 2C are cross-sectional process drawings illustrating manufacturing steps of a semiconductor device in an embodiment of the present invention.
Figure 2B:
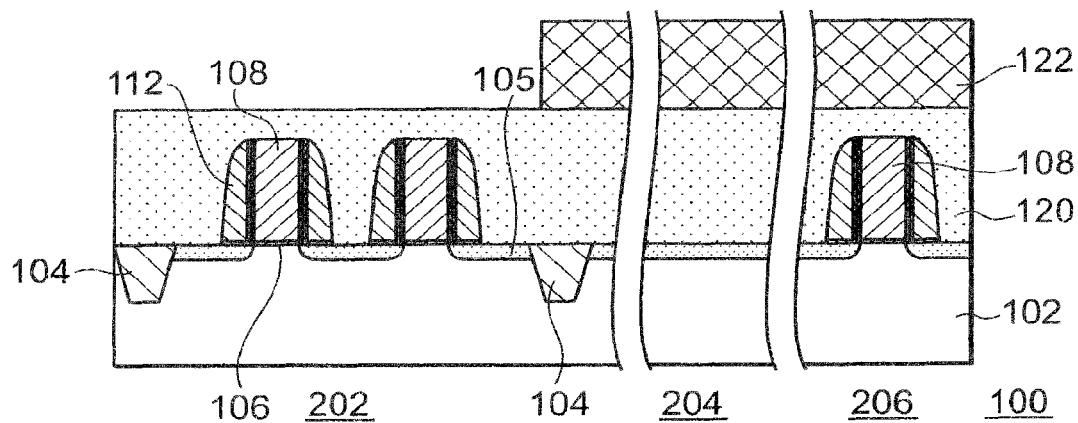

FIG. 2A illustrates a condition in which a plurality of transistors respectively containing the first gate 114a and the second gate 114b are formed on the silicon substrate 102. An extension region 105 is formed on the surface of the silicon substrate 102. In addition, the element-isolating insulator film 104 is formed on the surface of the silicon substrate 102, so that respective regions are electrically isolated from each other. At this time, the upper surface of the gate electrode 108 of the first gate 114a formed in the memory region 202 is level with the upper surface of the sidewalls 112 of the gate electrode 108.

Under this condition, the organic film 120 is formed over the entire surface of the silicon substrate 102 to bury the first gate 114a and the second gate 114b. For the organic film 120, it is possible to use, for example, a film commonly used as a BARC (Bottom Anti-Reflective Coating) film. In addition, a photo resist film 122 used to selectively create openings in the memory region 202 is formed on the organic film 120 (FIG. 2B) The photo resist film 122 can be formed by applying a resist material onto the organic film 120 and forming a pattern by means of exposure and development.

Figure 2C:
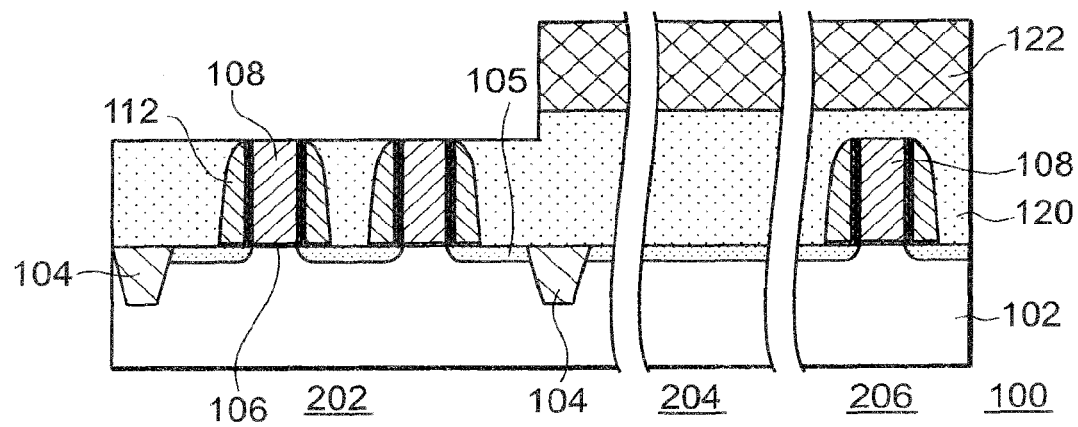

Subsequently, using the photo resist film 122 as a mask, the upper portion of the organic film 120 is removed by etching to expose the upper surface of the gate electrode 108 of the first gate 114a in the memory region 202 (FIG. 2C). Under this condition, polysilicon of the exposed surface of the gate electrode 108 is removed to a predetermined depth, to form the concave portion 124 in an upper portion inside the sidewalls 112 (FIG. 3A). As an etching gas, it is possible to use, for example, a gas the base of which is a Br-containing gas, such as HBr, and to which oxygen has been added as necessary. Consequently, it is possible to secure a high selection ratio between the insulator films composing the sidewalls 112 and the organic film 120. In addition, it is possible to adjust the selection ratio, in-plane uniformity, and the like by adding a gas containing a halogen element (Cl, F), such as $Cl_2$ or $CF_4$, or an inert gas, such as $N_2$, Ar or He. Furthermore, since the surface of the silicon substrate 102 is protected by the organic film 120, the surface of the silicon substrate 102 does not suffer any damage. The predetermined depth to which the gate electrode 108 is etched can be set to, for example, 50 nm.

Subsequently, the photo resist film 122 and the organic film 120 are removed to expose the surface of the silicon substrate 102 (FIG. 3B). Here, since the organic film 120 is composed of an organic material, the organic film 120 can be removed by ashing along with the photo resist film 122. By removing the organic film 120 by ashing, it is possible to expose the surface of the silicon substrate 102 without causing a film reduction in the sidewalls 112.

Subsequently, using the sidewalls 112 as masks, dopant ions are implanted into the surfaces of the silicon substrate 102 and the gate electrode 108. Then, a heat treatment is performed. Consequently, source/drain regions 103 are formed on the surface of the silicon substrate 102. Note that the implantation of dopant ions can be performed separately on various types of transistors, such as n-type and p-type transistors, using a photo resist film, though this is not illustrated. After that, a metal layer (not illustrated) is formed over the entire surface of the silicon substrate 102 and a heat treatment is performed, thereby forming a silicide layer 132 on the exposed surface of the silicon substrate 102. At this time, the surface of the gate electrode 108 is also silicided and a silicide layer 130 is formed thereon (FIG. 4A).

Subsequently, an insulator film 134 is formed over the entire surface of the silicon substrate 102 to fill the concave portion 124 of the first gate 114a in the memory region 202 with the insulator film 134 (FIG. 4B) Here, the insulator film 134 can be formed using a CVD (Chemical Vapor Deposition) method. In the present embodiment, the insulator film 134 can be formed using a plasma CVD method. Use of the plasma CVD method enables the insulator film 134 to be made thicker in the concave portion 124 on the gate electrode 108 of the first gate 114a surrounded by the sidewalls 112 than in a planar region like the diffusion region 204. The reason for being able to make the insulator film 134 thicker is considered to be that the insulator film 134 formed on the sidewalls of the concave portion 124 is pinched off within the concave portion 124. For example, if the thickness of the insulator film 134 is 25 nm in the diffusion region 204, then the thickness of the insulator film 134 can be set to approximately 75 nm on the gate electrode 108.

In addition, use of the plasma CVD method makes it difficult for the insulator film 134 to be formed in a region where an aspect ratio between the first gate 114a and the first gate 114a of the memory region 202 is high. Thus, the insulator film 134 in this region can be made thinner. In the present embodiment, the insulator film 134 can be composed of, for example, a silicon dioxide film.

Next, an etch stopper film 136 is formed on the insulator film 134. The etch stopper film 136 can also be formed using a CVD method. In the present embodiment, the etch stopper film 136 can be composed of, for example, a silicon nitride film.

Figure 5A:
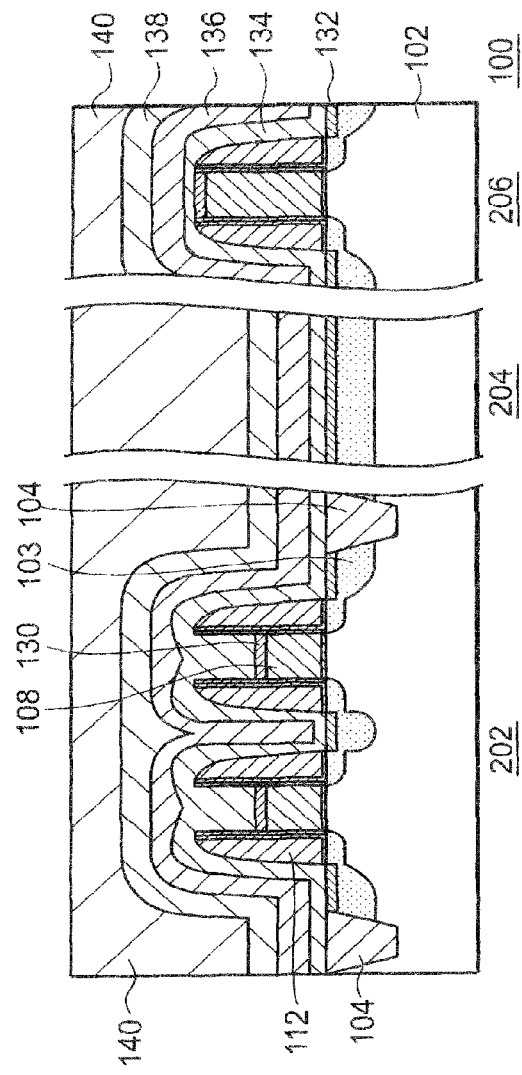
FIGS. 5A and 5B are also cross-sectional process drawings illustrating manufacturing steps of a semiconductor device in an embodiment of the present invention.

After that, an insulator film 138 is formed on the etch stopper film 136. The insulator film 138 can also be formed using a CVD method. In addition, in the present embodiment, the insulator film 138 can be composed of, for example, a silicon dioxide film. Subsequently, an interlayer insulator film 140 is formed on the insulator film 138 to bury the sidewalls 112 and the like (FIG. 5A). The interlayer insulator film 140 can also be formed using a CVD method. In the present embodiment, the interlayer insulator film 140 can be composed of, for example, a silicon dioxide film.

Then, a photo resist film (mask film, not illustrated) having openings used to form contact holes 150, 152 and 154 is formed on the interlayer insulator film 140. Here, an opening (first opening) formed in the photo resist film in the memory region 202 has a shape which overlaps, at least partially in plan view, with the first gate 114a and is open in a region on the silicide layer 132 of the surface of the silicon substrate 102 lateral to the gate electrode 108. In the present embodiment, an opening to be formed in the photo resist film in the memory region 202 can be formed so as to overlap, at least partially in plan view, with the gate electrode 108 of the first gate 114a. In addition, an opening (second opening) formed in the photo resist film in the logic region 206 has a shape which overlaps, in plan view, with the gate electrode 108 of the second gate 114b. After that, using the photo resist film as a mask, the contact hole 150 (first contact hole), the contact hole 152, and the contact hole 154 (second contact hole) are formed in the memory region 202, the diffusion region 204, and the logic region 206, respectively. Specifically, the interlayer insulator film 140 and the insulator film 138 are first etched. Here, as an etching gas, it is possible to use, for example, a CxFy-based gas, such as $C_5F_8$, $C_4F_8$, $C_4F_6$ or $C_2F_6$, in combination with an inert gas, such as Ar or He, or in combination with an $O_2$, $N_2$ or CO gas or the like. In addition, it is possible to add a CxHyFz-based gas, such as $CHF_3$. By using the CxFy-based gas as the base of the etching gas, it is possible to raise the etching selection ratio of $SiO_2/SiN$.

Subsequently, the etching gas is changed to etch the insulator film 136, thereby exposing the insulator film 134 on the bottom face of each contact hole. Here, as the etching gas, it is possible to use, for example, a CxHyFz-based gas, such as $CHF_3$, $CH_2F_2$ or $CH_3F$, to which an inert gas, such as Ar or He, or $O_2$ has been added. It is also possible to use a CxFy-based gas to which $H_2$ has been added, in place of the CxHyPz-based gas. By containing F, H, and O in the etching gas, it is possible to further raise an etching rate with respect to SiN.

Then, the etching gas is changed once again to etch the insulator film 134 exposed on the bottom face of each contact hole, thereby exposing the surface of the silicon substrate 102. Here, as the etching gas, it is possible to use $NF_3$, $CF_4$, Ar plasma or the like. It is also possible to perform a wet pre-treatment using a chemical containing DHF or $NH_4F$. Consequently, it is possible here to also perform a pretreatment for the film formation of a barrier metal. At this time, the insulator film 134 is formed thin in a region between the first gates 114a of the memory region 202. Accordingly, when forming the contact hole 150, it is possible to expose the silicide layer 132 in the bottom face of the contact hole 150 earlier than in other regions at the time of etching the insulator film 134 after the removal of the etch stopper film 136.

Figure 5B:
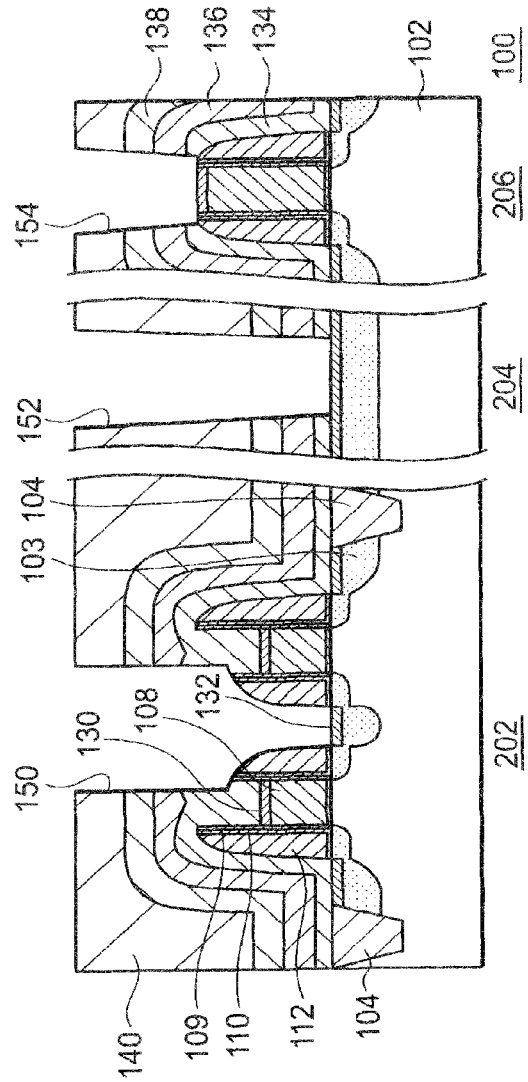

When the contact hole 152 or the insulator film 134 within the contact hole 154 is etched, the insulator film 134 on the gate electrode 108 of the first gate 114a is also etched more or less. On the other hand, the insulator film 134 is formed thicker in the concave portion 124 surrounded by the sidewalls 112 on the gate electrode 108 of the first gate 114a than in other regions. Accordingly, the silicide layer 130 on the gate electrode 108 of the first gate 114a can be placed in a state of being protected by the insulator film 134 and prevented from being exposed at points in time when the silicide layers 132 and 130 are exposed within the contact holes 152 and 154, respectively (FIG. 5B).

After this, a barrier metal film 160 and a metal film 162 are formed over the entire surface of the silicon substrate 102 to fill the contact holes 150, 152 and 154 with the barrier metal film 160 and the metal film 162. Subsequently, the metal film 162 and the barrier metal film 160 exposed outside the contact holes are removed using a chemical-mechanical polishing (CMP) method. Consequently, as illustrated in FIG. 1A, contacts 164, 166 and 168 are formed in the memory region 202, the diffusion region 204 and the logic region 206, respectively.

Figure 6A:
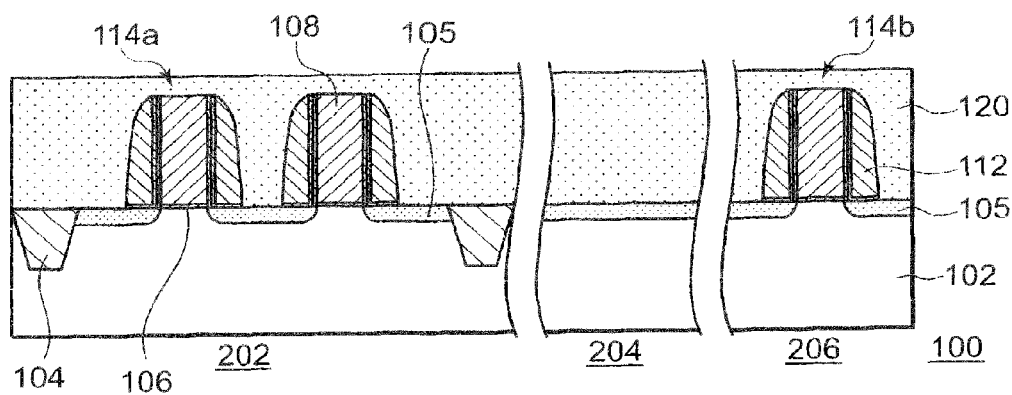
FIGS. 6A and 6B are cross-sectional views illustrating another example of manufacturing steps of a semiconductor device in an embodiment of the present invention.
Figure 6B:
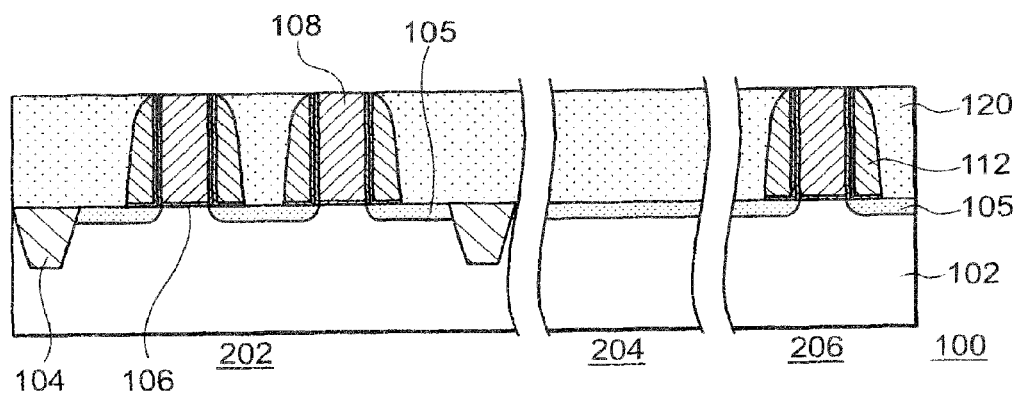
Figure 7:
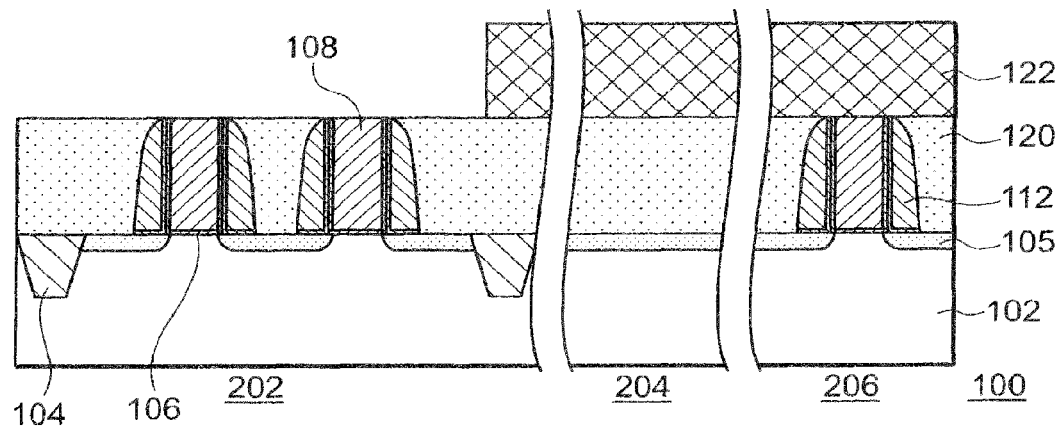
FIG. 7 is a cross-sectional view illustrating another example of manufacturing steps of a semiconductor device in an embodiment of the present invention.

FIGS. 6 and 7 illustrate modified examples of the above-described steps.

Here, it is possible to use the same steps as described with reference to FIG. 2 for up to the step of forming an organic film 120 on the silicon substrate 102 to bury the first gate 114a and the second gate 114b (FIG. 6A). In the present example, after the organic film 120 is formed, the upper surface of the organic film 120 is removed by CMP or the like and thereby the surface of the gate electrode 108 is exposed before a photo resist film 122 is formed (FIG. 6B). After that, the photo resist film 122, in the memory region 202 of which openings are selectively created, is formed on the organic film 120 (FIG. 7). Then, using the photo resist film 122 as a mask, the upper portion of the gate electrode 108 of the first gate 114a in the memory region 202 is removed, thereby forming a concave portion 124 which is the same as the concave portion 124 described with reference to FIG. 3A. For subsequent treatments, it is possible to use the same steps as those described with reference to FIGS. 3 to 5.

In the present embodiment, it is possible to attain both a self-aligned contact and a silicided structure of the substrate, while reducing damage to the substrate surface, by following the above-described steps. In the above-described embodiment, the insulator film 134 is formed over the entire surface of the silicon substrate 102 after the silicide layer 132 is formed on the surface of the silicon substrate 102 in the memory region 202 and in the logic region 206 thereof. At this time, it is possible to form the insulator film 134 relatively thick on the surface of the gate electrode 108 and relatively thin in a region between the sidewalls 112 of adjacent first gates 114a. With this configuration, it is possible to prevent the gate electrode from being exposed within contact holes when the contact holes are formed thereafter in a self-aligned manner. In addition, in the present embodiment, the surface of the silicon substrate 102 protected when the upper surface of the gate electrode 108 is removed in the memory region 202. Accordingly, it is possible to remove the upper surface of the gate electrode 108 without causing damage to the surface of the silicon substrate 102. Furthermore, the surface of the silicon substrate 102 is protected by the organic film 120 at this time. Accordingly, in a subsequent step, it is possible to expose the surface of the silicon substrate 102 without causing a film reduction in the insulator films of the sidewalls 112 and the like.

In addition, it is possible to attain both the self-aligned contact and the silicided structure of the substrate in the memory region 202, as well as form a salicide structure in the logic region 206. Here, the salicide structure refers to a structure in which a surface of a silicon substrate and a surface of a gate electrode made of polysilicon are silicided. Under normal conditions, such a salicide structure can be obtained by forming a silicidable metal film over the entire surface of the substrate and performing a heat treatment with the silicon substrate and the polysilicon surface exposed, thereby simultaneously siliciding the silicon surfaces. The salicide structure can also be obtained by separately siliciding the silicon surfaces.

Figure 8A:
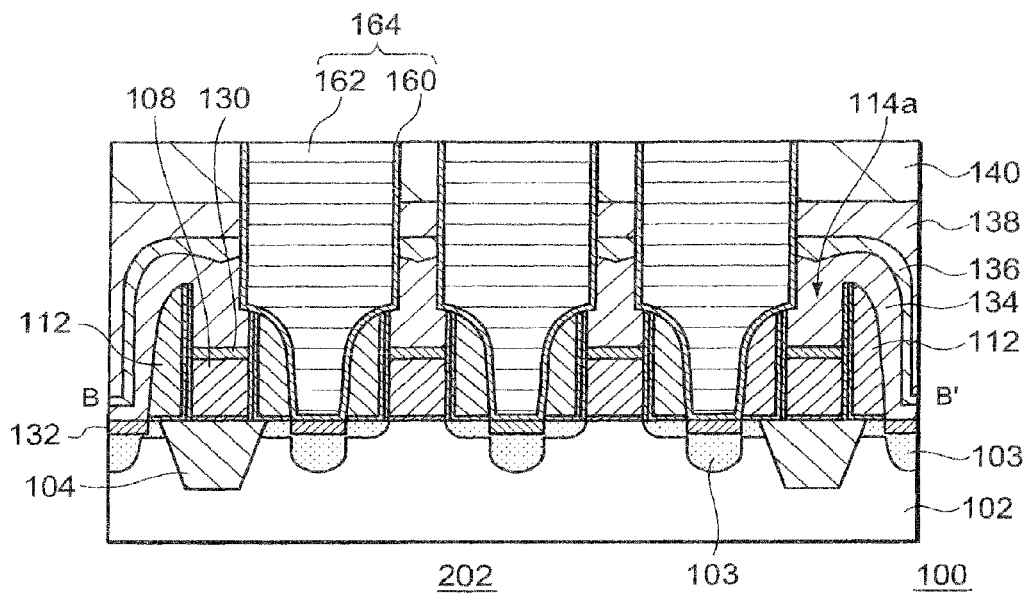
FIGS. 8A and 8B are schematic views illustrating one example of a configuration of a semiconductor device in an embodiment of the present invention.
Figure 8B:
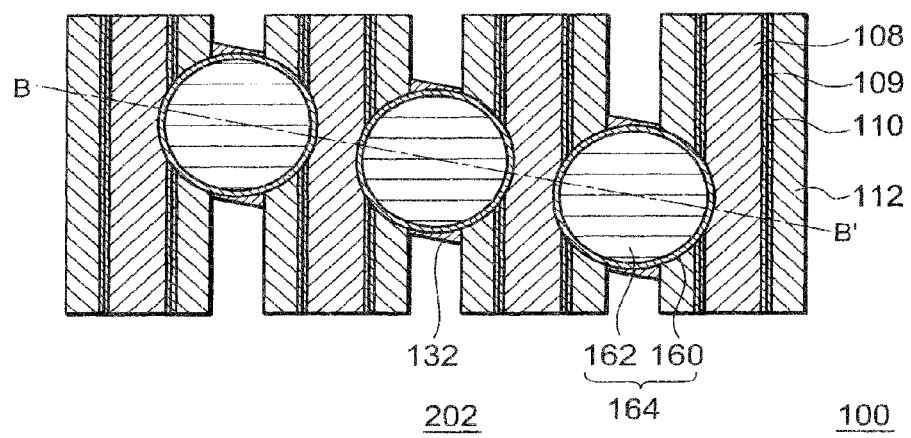

FIG. 8 is a schematic view illustrating a specific example of the semiconductor device 100 described with reference to FIGS. 1 to 7. Here, an example is shown in which a DRAM (Dynamic Random Access Memory) structure is formed in a memory region 202. FIG. 8A is a cross-sectional view, whereas FIG. 8B is a top view. FIG. 8A corresponds to the B-B' cross-sectional view of FIG. 8B. Here, four first gates 114a are arranged side by side. In addition, a self-aligned contact (contact 164) is formed between the sidewalls 112 of each adjacent first gates 114a.

Figure 9:
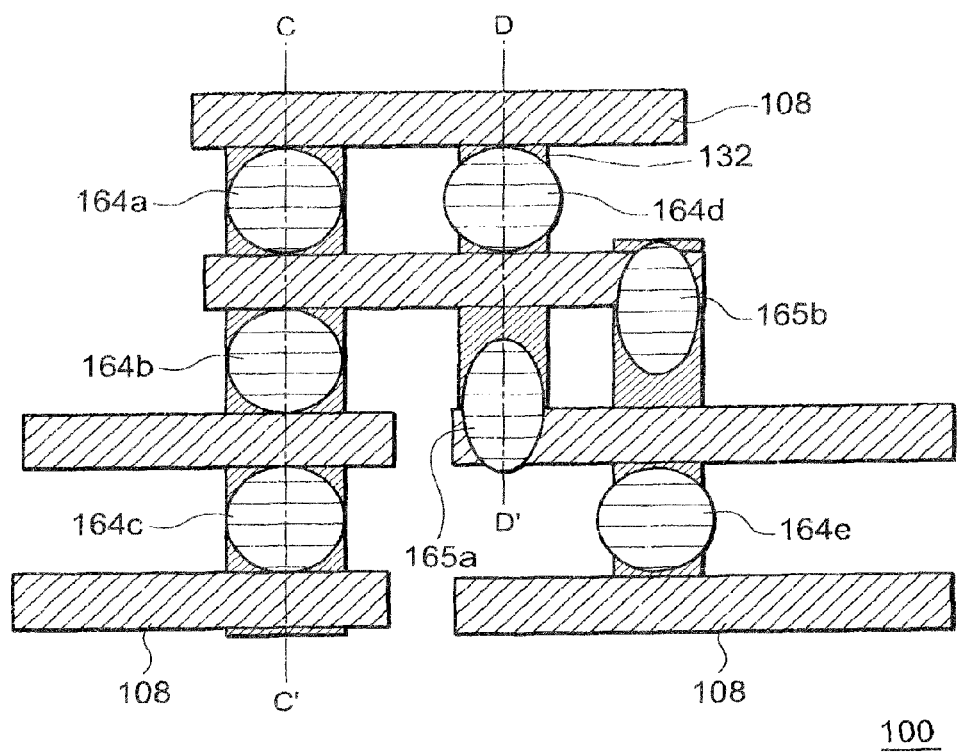
FIG. 9 is a top view illustrating one example of a configuration of a semiconductor device in an embodiment of the present invention.
Figure 10A:
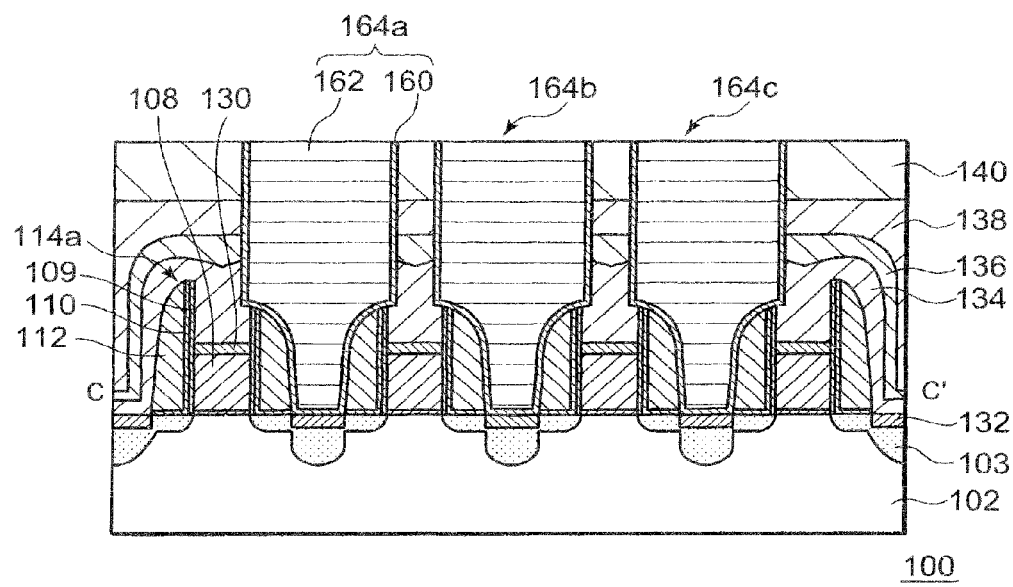
FIGS. 10A and 10B are cross-sectional views illustrating one example of a configuration of a semiconductor device in an embodiment of the present invention.
Figure 10B:
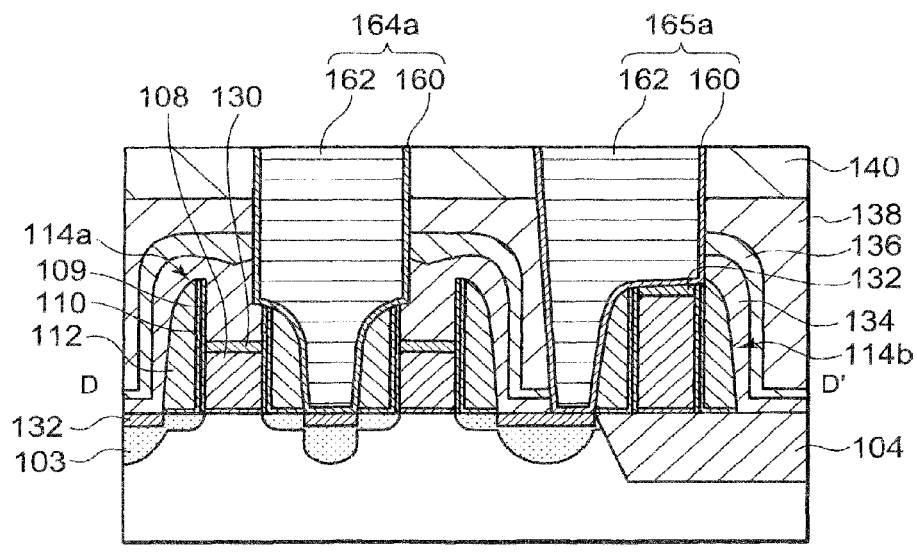

FIGS. 9 and 10 are schematic views illustrating another specific example of the semiconductor device 100 described with reference to FIGS. 1 to 7. Here, an example is shown in which an SRAM (Static Random Access Memory) structure is formed in the memory region 202. FIG. 9 is a top view, whereas FIG. 10A is the C-C' cross-sectional view of FIG. 9 and FIG. 10B is the D-D' cross-sectional view of FIG. 9.

As illustrated in FIG. 9, the semiconductor device 100 has a mixture of self-aligned contacts (self-aligned contacts 164a, 164b, 164c, 164d and 164e) not connected to the gate electrodes 108 and common contacts (common contacts 165a and 165b) connected to the gate electrodes 108 and also electrically connected to source/drain regions 103 lateral to the gate electrodes 108. In such a case, it has been especially difficult to attain both a salicide structure and a self-aligned contact.

For example, if an attempt is made to adopt a salicide structure in which a surface of a silicon substrate and a surface of a gate electrode are simultaneously silicided, the surface of the silicon substrate needs to be exposed after gate formation. On the other hand, in order to form a self-aligned contact to be not electrically connected to the gate electrode, a reasonably thick insulator film needs to be formed on the gate electrode. It has also been difficult, however, to selectively form a thick insulator film on the gate electrode. Accordingly, there have not been any techniques to attain both a self-aligned contact and a salicide structure. Therefore, there has been room for improvement from the viewpoint of speeding up transistors. The inability to speed up a transistor in turn has made it impossible to decrease the size of a peripheral circuit for driving the transistor. Thus, it has not been possible to miniaturize semiconductor devices. According to the method of the present embodiment, it is possible to attain both a self-aligned contact and a salicide structure. Consequently, it is possible to further miniaturize high-speed devices, such as a system LSI and an embedded memory.

Second Embodiment

FIGS. 11 to 14 are cross-sectional process drawings illustrating manufacturing steps of a semiconductor device in the present embodiment.

The present embodiment differs in the manufacturing steps of the semiconductor device 100 from the first embodiment in that an insulator film 170 and a polysilicon layer 171 are previously formed on a gate electrode 108 before sidewalls are formed. Also here, the gate electrode 108 can be made of polysilicon.

In the present embodiment, a gate insulator film 106, a gate electrode 108, an insulator film 170 and a polysilicon layer 171 are deposited in this order over the entire surface of the silicon substrate 102, after an element-isolating insulator film 104 is formed on a surface of a silicon substrate 102. The insulator film 170 can be composed of, for example, a silicon dioxide film. Here, the film thicknesses of the insulator film 170 and the polysilicon layer 171 define the depth of a concave portion 124 to be formed later inside sidewalls 112. The film thicknesses of the insulator film 170 and the polysilicon layer 171 may be set to, for example, approximately 5 nm and 50 nm, respectively.

Next, a photo resist film (not illustrated) having a gate-shaped opening is formed over the entire surface of the silicon substrate 102. Using the photo resist film as a mask, the polysilicon layer 171, the insulator film 170, the gate electrode 108 and the gate insulator film 106 are subjected to patterning. After that, impurities are ion-implanted using the gate electrode 108 patterned into a gate shape and the like as masks, to form an extension region 105 on the surface of the silicon substrate 102. Then, sidewalls 112 which comprise an insulator film 109, a liner insulator film 110 and another insulator film 111 are formed same as first embodiment.

Figure 11A:
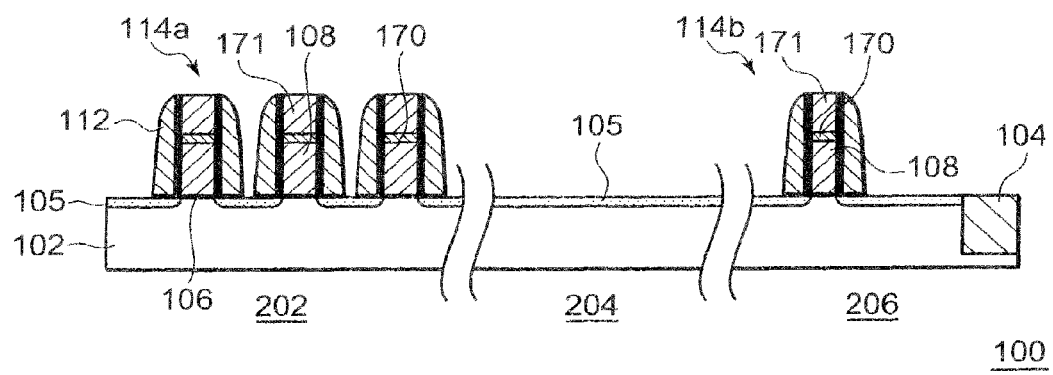
FIGS. 11A, 11B and 11C are cross-sectional process drawings illustrating manufacturing steps of a semiconductor device in an embodiment of the present invention.
Figure 11B:
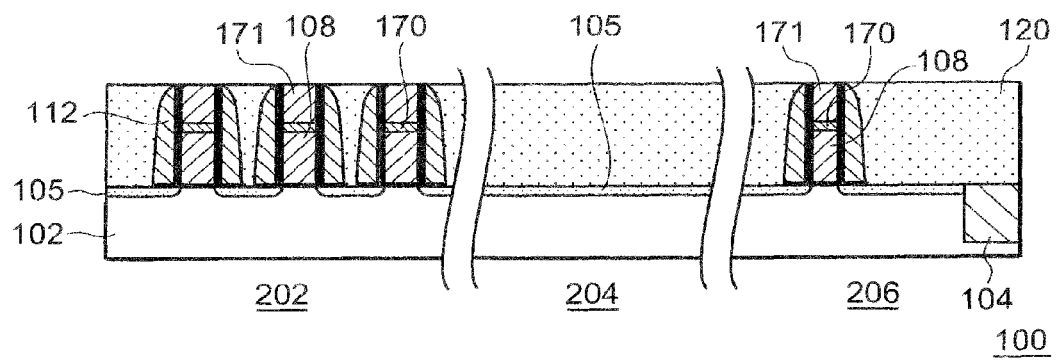

FIG. 11A is a schematic view illustrating this condition. Here, a condition is shown in which three first gates 114a and one second gate 114b are formed in the memory region 202 and the logic region 206, respectively. In the present embodiment, the gate electrode 108 is formed narrower in width at the second gate 114b formed in the logic region 206 than at the first gate 114a formed in the memory region 202. However, the widths may be equal to each other or may be set the other way around, according to the purpose of use. When the semiconductor device is in the condition illustrated in FIG. 11A, the upper surfaces of the polysilicon layers 171 of the first gate 114a and the second gate 114b are level with the upper surfaces of the sidewalls 112.

Figure 11C:
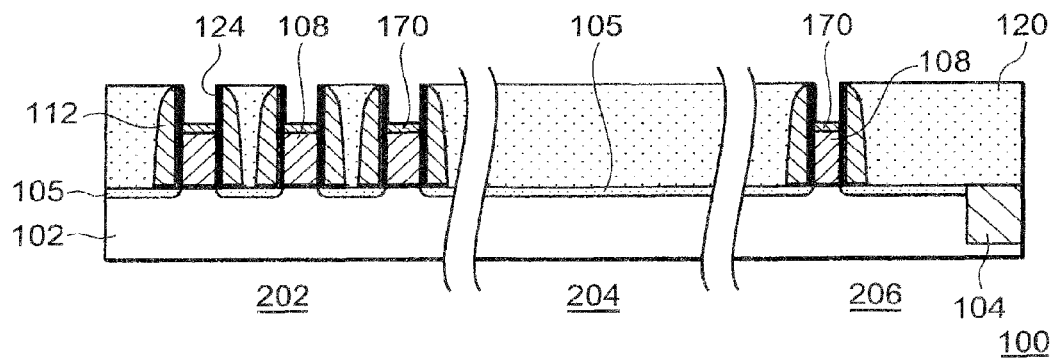

Under this condition, an organic film 120 is formed over the entire surface of the silicon substrate 102 to bury the first gate 114a and the second gate 114b. Subsequently, the upper surface of the organic film 120 is removed by CMP or the like, to expose the polysilicon layer 171 (FIG. 11B) Then, the exposed polysilicon layer 171 is removed to form a concave portion 124 in an upper portion inside the sidewalls 112 (FIG. 11C). In the present embodiment, the insulator film 170 is formed between the gate electrode 108 and the polysilicon layer 171. Accordingly, it is possible for the insulator film 170 to function as an etch stopper film when the polysilicon layer 171 is removed. Then, the etching gas is changed to remove the insulator film 170. Consequently, a surface of the gate electrode 108 is exposed. Thus, it is possible to equalize the depths of the concave portions 124 of respective gates. At this time, the surface of the silicon substrate 102 is protected by the organic film 120 and, therefore, does not suffer damage.

Figure 12A:
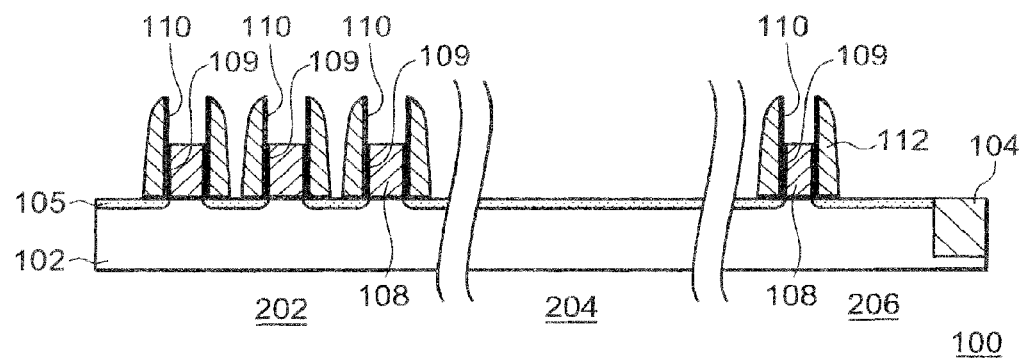
FIGS. 12A, 12B and 12C are also cross-sectional process drawings illustrating manufacturing steps of a semiconductor device in an embodiment of the present invention.

Subsequently, the organic film 120 is removed by ashing, to expose the surface of the silicon substrate 102 (FIG. 12A). By removing the organic film 120 by ashing, it is possible to expose the surface of the silicon substrate 102 without causing a film reduction in the sidewalls 112.

Figure 12B:
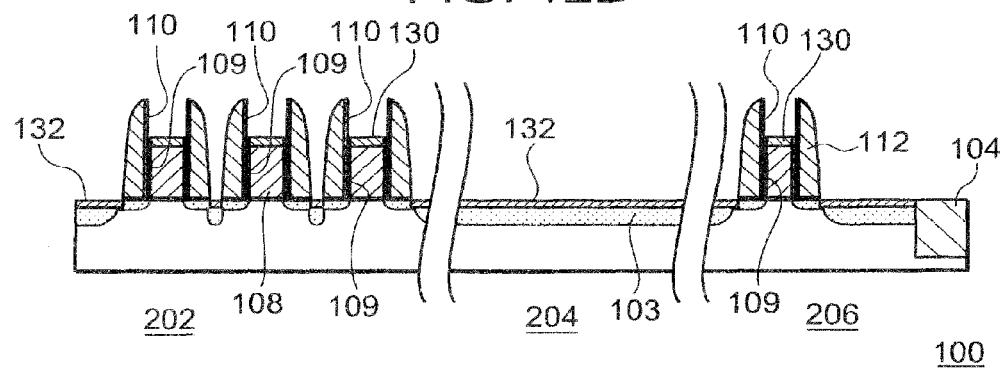
Figure 12C:
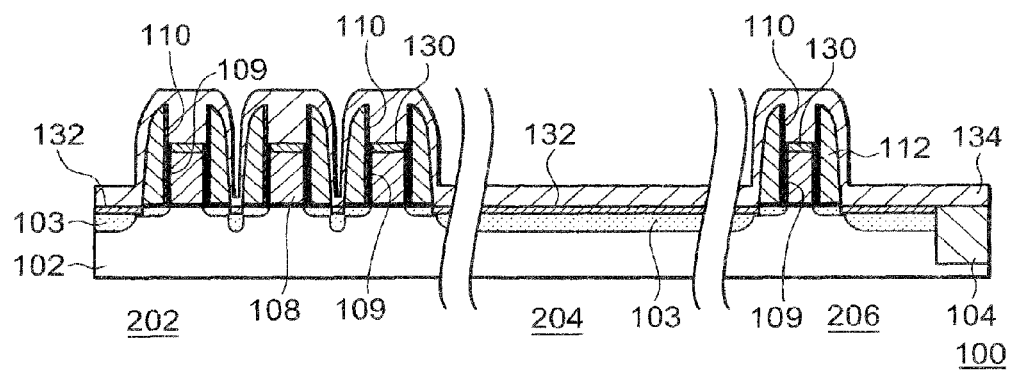

Next, using the sidewalls 112 as masks, dopant ions are implanted into the surfaces of the silicon substrate 102 and the gate electrode 108. Then, a heat treatment is performed. Consequently, there are formed source/drain regions 103. Note that the implantation of dopant ions can be performed separately on various types of transistors, such as n-type and p-type transistors, using a photo resist film, though this is not illustrated. After that, a metal layer (not illustrated) is formed over the entire surface of the silicon substrate 102, to form a silicide layer 132 on the exposed surface of the silicon substrate 102. At this time, the surface of the gate electrode 108 is also silicided and a silicide layer 130 is formed thereon (FIG. 12B).

After that, an insulator film 134, an etch stopper film 136, an insulator film 138, and an interlayer insulator film 140 are formed in this order over the entire surface of the silicon substrate 102 in the same way as in the first embodiment. In the present embodiment, an example is shown in which an interlayer insulator film 142 is further formed on the interlayer insulator film 140. Here, in order to planarize the surface of a resulting interlayer insulator film, the surface of the interlayer insulator film 140 is planarized by CMP after the interlayer insulator film 140 is formed, and the interlayer insulator film 142 is further formed thereon. The interlayer insulator film 142 can be composed of the same silicon dioxide film as the one of which the interlayer insulator film 140 is composed.

After that, a photo resist film (not illustrated) having openings used to form contact holes 172, 174 and 176 is formed on the interlayer insulator film 142. Here, an opening formed in the photo resist film in the memory region 202 has a shape which overlaps, in plan view, with part of the gate electrode 108 of the first gate 114a. Subsequently, using the photo resist film as a mask, contact holes 172 and contact holes 174 and 176 are formed in the memory region 202 and in the logic region 206, respectively (FIG. 13A).

Also in the present embodiment, the insulator film 134 is formed thin in a region between the first gates 114a of the memory region 202 at this time. Accordingly, when forming a contact hole 150, it is possible to expose the silicide layer 132 in the bottom face of the contact hole 172 earlier than in other regions at the time of etching the insulator film 134 after the removal of the etch stopper film 136. In addition, the insulator film 134 is formed thicker in a concave portion 124 surrounded by the sidewalls 112 on the gate electrode 108 of the first gate 114a than in other regions. Accordingly, the silicide layer 130 on the gate electrode 108 of the first gate 114a can be placed in a state of being protected by the insulator film 134 and prevented from being exposed at a point in time when the silicide layer 132 is exposed within the contact hole 172.

In the present embodiment, the contact hole 174 is formed, in plan view, on the second gate 114b of the logic region 206. In the present embodiment, the concave portion 124 is formed in the upper portion of the gate electrode 108 also in the logic region 206 and is filled with the insulator film 134. Accordingly, even if the insulator film 134 is etched away so that the silicide layer 132 is exposed on the bottom face of the contact hole 172 or the contact hole 176, the insulator film 134 remains left on the bottom face of the contact hole 174. Here, if etching is continued so as to completely remove the insulator film 134, there is the possibility that the etching of sidewalls 112 progresses within the contact hole 172, thus causing the silicide layer 130 to become exposed. For this reason, in the present embodiment, etching is finished temporarily at a point in time when the silicide layer 132 is exposed on the bottom faces of the contact holes 172 and 176.

Next, a photo resist film 178 is formed over the entire surface of the silicon substrate 102, to form an opening 180 used to remove the insulator film 134 within the contact hole 174 (FIG. 13B).

Subsequently, using the photo resist film 178, the insulator film 134 left on the bottom face of the contact hole 174 is removed In addition, the insulator film 109, the liner insulator film 110, the insulator film 111 and the like are removed to expose the silicide layer 130 of the upper surface of the gate electrode 108 on the bottom face of the contact hole 182. At this time, the contact holes 172 and 176 are protected by the photo resist film 178 and, therefore, the sidewalls 112 of the first gate 114a are not etched. Thus, it is possible to selectively remove only the insulator film within the contact hole 182. Removing the photo resist film 178 results in the view of FIG. 14A.

Figure 14A:
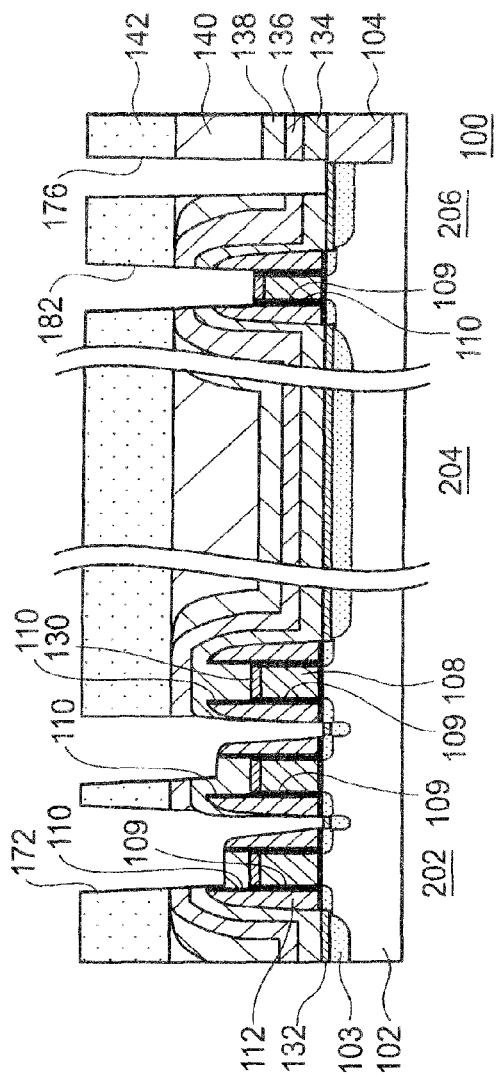
FIGS. 14A and 14B are also cross-sectional process drawings illustrating manufacturing steps of a semiconductor device in an embodiment of the present invention.
Figure 14B:
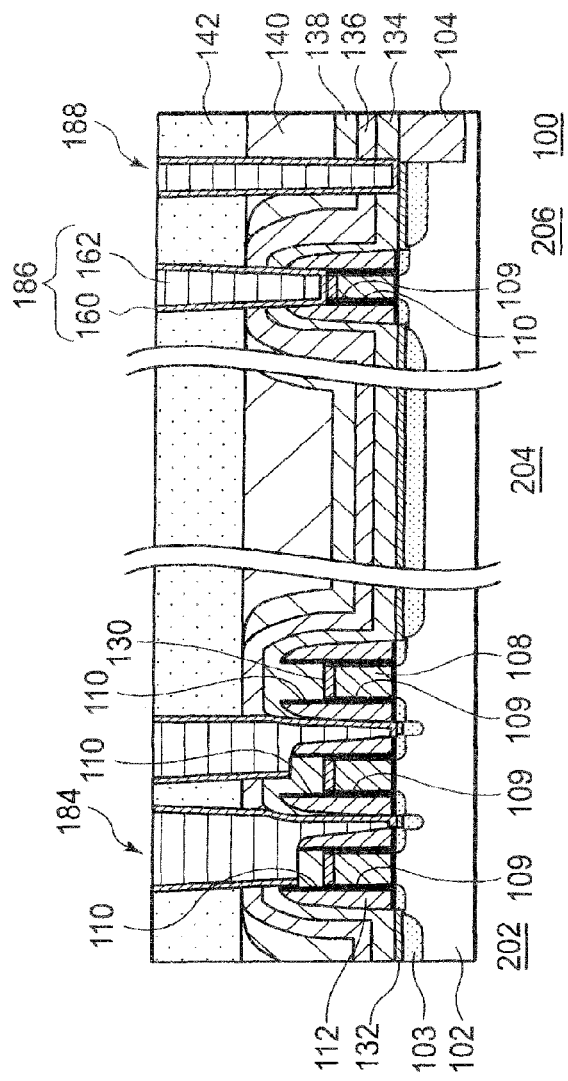
Figure 15A:
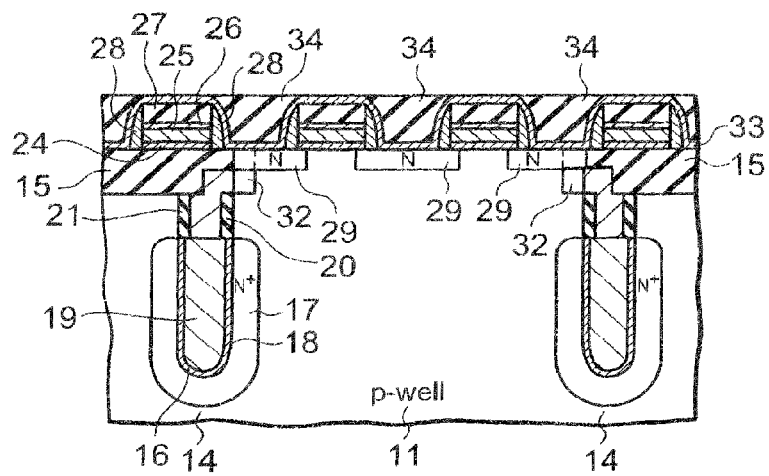
FIGS. 15A, 15B and 15C are cross-sectional process drawings illustrating manufacturing steps of a conventional semiconductor device.
Figure 15B:
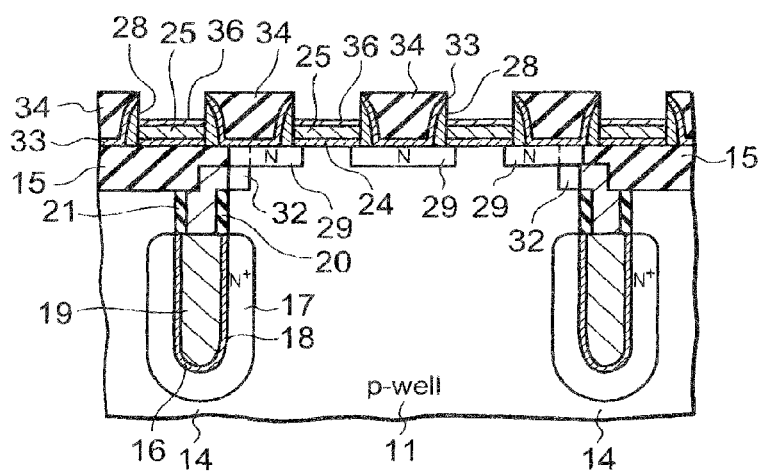
Figure 15C:
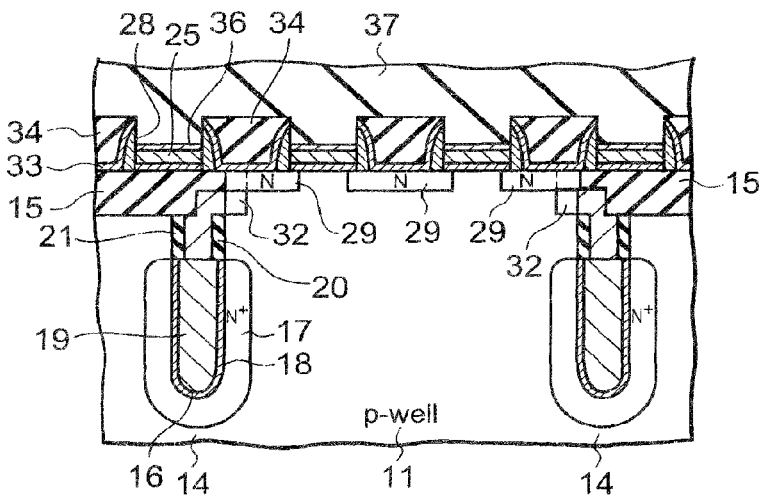
Figure 16A:
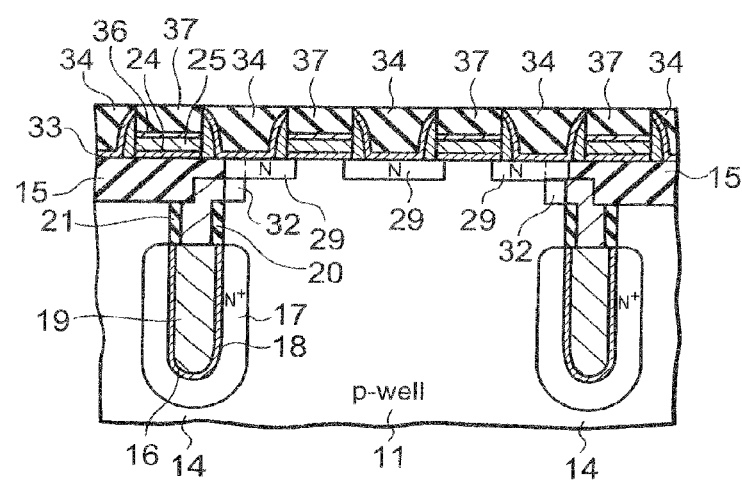
FIGS. 16A and 16B are cross-sectional process drawings also illustrating manufacturing steps of a conventional semiconductor device.
Figure 16B:
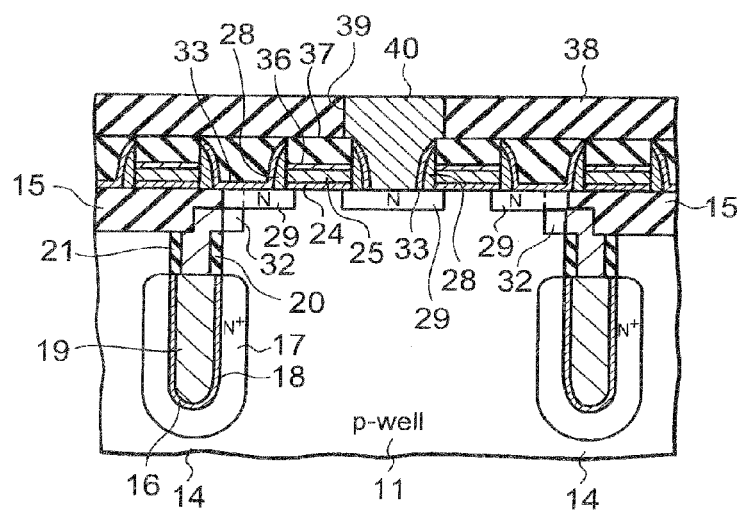

After that, a barrier metal film 160 and a metal film 162 are formed over the entire surface of the silicon substrate 102 to fill the contact holes 172, 182 and 176. In addition, the barrier metal film 160 and the metal film 162 outside the contact holes are removed by CMP. Consequently, contacts 184 and contacts 186 and 188 are formed in the memory region 202 and in the logic region 206, respectively (FIG. 14B).

Also in the present embodiment, there are obtained the same advantageous effects as obtained in the first embodiment.

In addition, according to the method of the present embodiment, it is possible to control the depth of the concave portion 124 when forming the concave portion 124 inside the sidewalls 112. Consequently, it is possible to control gate electrodes 108 so as to be ultimately uniform in height.

While a description has been given of embodiments of the present invention with reference to the accompanying drawing, these embodiments are illustrative only. Accordingly, it is possible to adopt various configurations other than those described above.

Figure 17A:
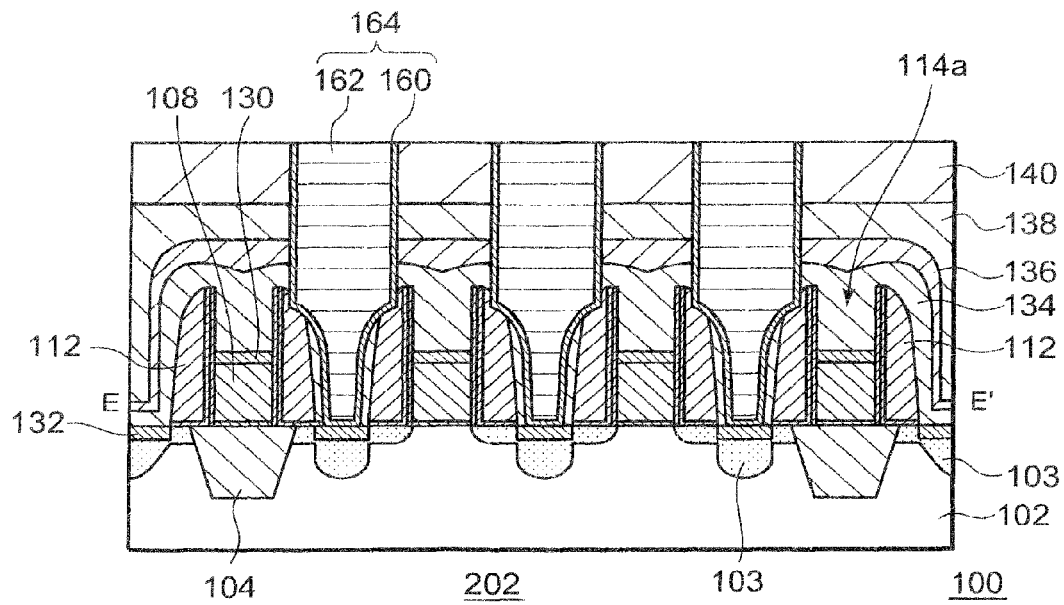
FIGS. 17A and 17B are schematic views illustrating another example of the semiconductor device illustrated in FIG. 8.
Figure 17B:
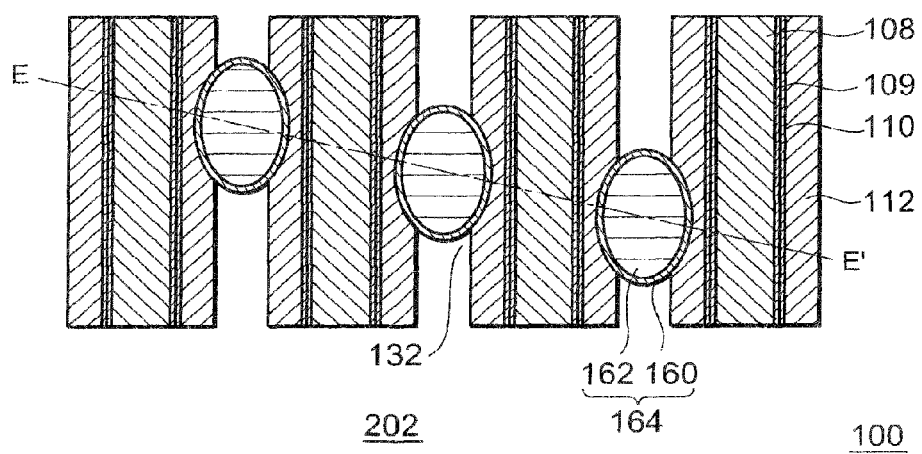

In the embodiments described heretofore, an explanation has been made by taking as an example the case where the contact 164 has a round shape in plan view. However, the contact 164 may alternatively have an elliptical shape, in plan view, the width of which is smaller in the gate length direction thereof. FIG. 17 is a schematic view illustrating this example. FIG. 17 shows another example of the semiconductor device illustrated in FIG. 8, wherein FIG. 17A is a cross-sectional view, whereas FIG. 17B is the E-E' cross-sectional view of FIG. 17A. By adopting such a configuration as mentioned above, it is possible to widen the area of contact between the contact 164 and the silicide layer 132, while keeping a gate-to-gate width narrow. Thus, it is possible to achieve low resistance.

Furthermore, while in the above-described embodiments, an example has been shown in which a self-aligned contact is formed in the memory region 202, it is possible to provide a self-aligned contact also in the logic region 206, according to the purpose of use. Consequently, it is possible to narrow a gate-to-gate distance also in the logic region 206.

It is apparent that the present invention is not limited to the above embodiments and descriptions, but may be modified and changed without departing from the scopes and sprits of the methods claims that are indicated in the subsequent pages as well as apparatus claims that are indicated below:

AA. A semiconductor device comprising:
  a silicon substrate;
  a first gate including a gate electrode formed on said silicon substrate and sidewalls;
  a silicide layer formed adjacently to said sidewalls of said first gate on a surface of said silicon substrate; and
  a first contact reaching to a region including said first gate and said silicide layer formed adjacently to said sidewalls of said first gate;
  wherein an insulator film is located between said first contact and said gate electrode of said first gate.

BB. The semiconductor device according to claim 10, wherein said gate electrode of said first gate is made of polysilicon and a silicide layer is also formed on a surface of said polysilicon.

CC. The semiconductor device according to claim 10, wherein a memory region and a logic region are provided on said silicon substrate and said first gate is formed on said memory region.

DD. The semiconductor device according to claim 12, further including:
  a second gate formed on said logic region on said silicon substrate and including a gate electrode made of polysilicon and sidewalls; and
  a second contact electrically connected to said gate electrode of said second gate;
  wherein a silicide layer is formed on the surface of said polysilicon of said second gate and said second contact is provided connected to said silicide layer.

EE. The semiconductor device according to claim 10, wherein a region between two said first gates is higher in aspect ratio than said concave portion in an upper portion inside said sidewalls.

What is claimed is:

1. A method of manufacturing a semiconductor device, comprising steps of:
  forming a first gate comprising a polysilicon gate electrode and sidewalls on a silicon substrate;
  forming an organic film over the first gate and a surface of the silicon substrate;
  removing an upper portion of the organic film to expose an upper surface of the polysilicon gate electrode;
  removing an upper portion of the polysilicon gate electrode, thereby exposing a recessed surface of the polysilicon gate electrode between the sidewalls;
  removing the organic film to expose the surface of the silicon substrate;

forming a silicide layer simultaneously on the exposed surface of the silicon substrate and the recessed surface of the polysilicon gate electrode;

forming an insulator film over the silicon substrate and on the recessed surface of the polysilicon gate electrode;

forming a first contact hole extending to the silicide layer on the silicon substrate and overlying an adjacent portion of the first gate; and forming a first self-aligned contact in the first contact hole, wherein the first self-aligned contact connects to the silicide layer on the silicon substrate, and wherein a remaining portion of the insulator film is disposed between the first self-aligned contact and the first gate.

2. The method according to claim 1, further comprising a third gate formed side by side with said first gate on said silicon substrate, and wherein said first contact hole overlies an adjacent region of each of said first and third gates on either side of the silicide layer formed on the silicon substrate.

3. The method according to claim 1, wherein said insulator film comprises a first insulator film in contact with said silicide layer on the surface of said silicon substrate between a third gate and said first gate, and a second insulator film having an etching selection ratio with respect to said first insulator film in contact with said first insulator film.

4. The method according to claim 3, wherein said first insulator film is formed using a plasma CVD method.

5. The method according to claim 1, wherein said silicon substrate has a memory region and a logic region, and wherein said first gate is formed in said memory region.

6. The method according to claim 5, wherein:
a second gate comprising a polysilicon gate electrode and sidewalls is formed in said logic region;
said organic film is formed over said first and second gates;
an upper portion of said organic film is removed to expose an upper surface of said polysilicon gate electrode of said first gate while maintaining said organic film over said second gate;
said first contact hole and a second contact hole are simultaneously formed such that said second contact hole extends to said second gate;
a second contact is formed to connect to said second gate electrode.

7. The method for manufacturing a semiconductor device according to claim 1, wherein:
said first gate comprises a first polysilicon layer, an intermediate insulator film, and a second polysilicon layer deposited in this order;
an upper surface of said second polysilicon layer is exposed during said removing of said organic film; and
said second polysilicon layer and said intermediate insulator film are removed to expose an upper surface of said first polysilicon layer.

* * * * *